United States Patent
Venambre et al.

(10) Patent No.: US 6,198,044 B1
(45) Date of Patent: Mar. 6, 2001

(54) PROCESS FOR MANUFACTURE OF A MICROCIRCUIT BOARD PERMITTING LIMITATION OF THE MECHANICAL STRESSES TRANSMITTED TO THE MICROCIRCUIT AND BOARD THUS OBTAINED

(75) Inventors: Jacques Venambre, IFS; Francois Bouchez, Verson, both of (FR)

(73) Assignee: De la rue Cartes et Systemes, Paris (FR)

(*) Notice: Subject to any disclaimer, the term of this patent is extended or adjusted under 35 U.S.C. 154(b) by 0 days.

(21) Appl. No.: 09/344,106

(22) Filed: Jun. 24, 1999

(30) Foreign Application Priority Data

Jul. 7, 1998 (FR) .................................................. 98 08673

(51) Int. Cl.[7] .......................... H01R 43/00; H01L 23/12

(52) U.S. Cl. ......................... 174/52.4; 29/831; 29/827; 174/52.4; 361/760

(58) Field of Search ............................ 29/827, 840, 831; 174/52.4; 264/272.17, 272.14; 235/488, 492; 361/760

(56) References Cited

U.S. PATENT DOCUMENTS

| | | | | |
|---|---|---|---|---|
| 3,851,223 | * | 11/1974 | Yonezuka et al. | 361/777 |
| 4,996,411 | * | 2/1991 | Rbjock | 235/488 |
| 5,005,282 | * | 4/1991 | Rose | 29/827 |
| 5,647,122 | * | 7/1997 | Launay et al. | 29/840 |

FOREIGN PATENT DOCUMENTS

| | | |
|---|---|---|
| 44 31 754 C1 | 11/1995 | (DE). |
| 0 371 855 A1 | 11/1989 | (EP). |
| 0 599 194 A1 | 11/1993 | (EP). |
| 0 688 0541 A1 | 6/1995 | (EP). |

* cited by examiner

*Primary Examiner*—Stephen F. Gerrity
*Assistant Examiner*—Rhonda E. Sands
(74) *Attorney, Agent, or Firm*—Oliff & Berridge, PLC

(57) ABSTRACT

A method of manufacturing a microcircuit board with a mechanical cut-out piece between the microcircuit and the board to limit stresses transmitted to the microcircuit. A blank of a network of conductors is created and the microcircuit is fixed in a container formed by shaping the blank, the microcircuit keeping the different parts of the network in position relative to each other and the module thus formed is installed in a cavity in the board by fixing the external connection areas onto the upper surface of the cavity.

20 Claims, 4 Drawing Sheets

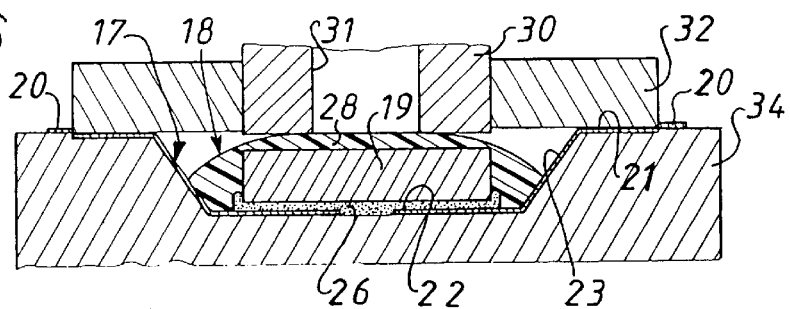
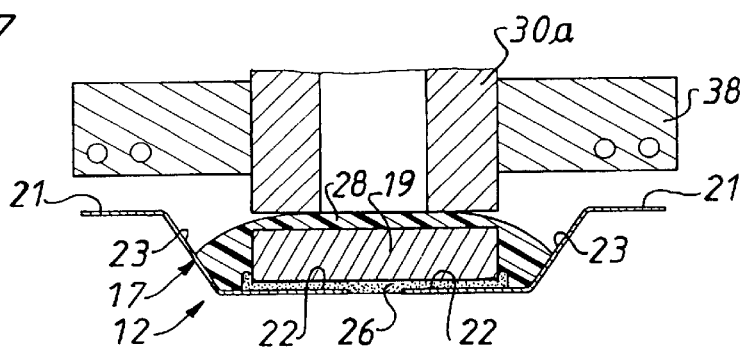
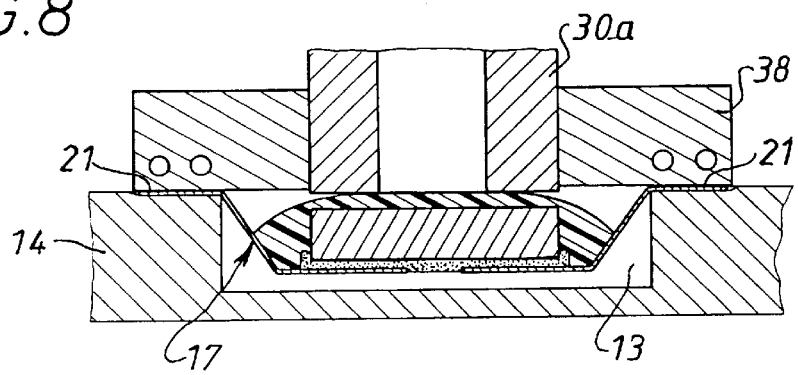
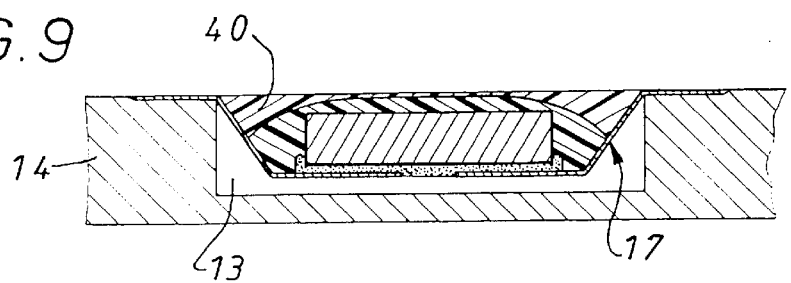

PROCESS FOR MANUFACTURE OF A MICROCIRCUIT BOARD PERMITTING LIMITATION OF THE MECHANICAL STRESSES TRANSMITTED TO THE MICROCIRCUIT AND BOARD THUS OBTAINED

FIELD OF THE INVENTION

The invention relates to a method of manufacturing a microcircuit board the method comprising the steps of forming a cavity in a part of the thickness of the board made of insulating material for forming the support, and fixing the microcircuit within the cavity while connecting it to a network of conductors so as to establish electrical connections between the cavity and a surface of the board.

In particular, the invention relates to a method of installing the microcircuit and the network of conductors in order to reduce the stresses which can be transmitted to the microcircuit when the board undergoes distortion after it has been manufactured.

The invention also relates to a microcircuit board produced the implementation of such a process.

DESCRIPTION OF THE PRIOR ART

In the manufacturing of microcircuit boards, it is known to install the microcircuit in a cavity formed in a part of the thickness of the board made of plastics material forming the support. The cavity is open on one surface of this board. On this surface, at its bottom and on its sides, it is conventional to arrange a network of conductors allowing electrical connection of the connection zones of the microcircuit to external connection areas defined on the surface around the cavity. When such a network of conductors is used, it is advantageous to use a particular technique for installing the microcircuit, known by the name "flip-chip". In fact, the microcircuit includes connection zones which are defined on one of its surfaces and which permit access to the microprocessor and to associated memories. This installing technique consists of fixing and electrically connecting, in a same operation, the microcircuit to the network of conductors and more particularly to parts of the latter which extend and adhere on the bottom of the cavity.

Because the microcircuit is rigidly fixed to the bottom of the cavity, any distortion of the board results in stresses which are transmitted to the microcircuit, which can damage or render the microcircuit unusable in particular during the cracking the material (silicon) forming the microcircuit or during the breaking of an electrical interconnection.

The invention enables these difficulties to be overcome and the reliability of such a microcircuit board to be improved.

SUMMARY OF THE INVENTION

The basic idea of the invention separately produces a module made from a sheet of electrically conductive material, intended to form the network of conductors and of fitting the microcircuit to it in such a way that it is fixed and connected to the conductors of the circuit before the whole is assembled with the board by fixing the external connection areas of the network to the surface of the board, all around the opening of the cavity. In other words, the microcircuit is separate from the bottom of the cavity (or "suspended" in it) and the network of conductors provides a flexible connection between the microcircuit and the board, which greatly reduces distortion stresses applied to the board.

More precisely, the invention relates to a method of manufacturing a microcircuit board comprising the steps of forming a cavity in a part of the thickness of a board made of insulating material for forming a support, the cavity open on one surface of the board, creating a network of conductors to establish electrical connections between the cavity and the surface of the board, and of connecting the microcircuit to the network of conductors, producing a module comprising the network and the microcircuit in such a manner that a blank of the network is shaped to at least partially define a container and that the microcircuit is fixed to the network while keeping different parts of the network in position relative to each other, cutting off outer parts of the blank to form external connection areas, placing the module in the cavity with the external connection areas resting on the surface, and fixing the external connection areas onto the surface.

In other words, in accordance with a first exemplary embodiment, the microcircuit is connected to the board by means of a limited numbers of flexible junctions formed by the tracks of the network of conductors itself, these tracks leading to the external connection areas adhered to the surface of the board, all around the cavity. This type of construction considerably reduces the stresses transmitted to the microcircuit. However, the remainder of the cavity may be filled with different types of resins or similar filler materials, which are more or less flexible and deformable.

The invention also relates to a microcircuit board produced by implementation of the process defined above.

BRIEF DESCRIPTION OF THE DRAWINGS

The invention will be better understood and will become clearer from several alternative embodiments of the process in accordance with its principle, given solely as examples and with reference to the attached drawings in which:

FIGS. 1 to 9 and FIG. 2b show the stages of a process in accordance with the invention; and, FIGS. 10 to 18 and FIGS. 11b, 12b and 14b show the stages of an alternative embodiment of the process.

DETAILED DESCRIPTION OF THE EMBODIMENTS

Figure 1:

With reference to FIGS. 1 to 8, a first possible process will be described for manufacture of a microcircuit board.

In the drawings, FIGS. 1 to 7 show the production of a module 12 and FIGS. 8 and 9 show the installation of this module in the cavity 13 of the board 14.

The manufacture of the module 12 starts from a sheet of conductive material 15 and preferably a strip (FIG. 1). This sheet may possibly be of copper and preferably nickel-plated and gold-plated. Conventionally, the strip is very thin of the order of some tens of microns. It is intended to form the network of conductors mentioned above. A first possible step consists of defining a blank 16 of the network 17 on the strip of conductive material, this blank being required to define, at least partially, a container 18 suitable to contain the microcircuit 19 electrically connected to elements of the blank. To do this, in accordance with the example, the strip is etched, cut out, or machined (possibly using a laser beam) so as to isolate all of the elements of the network from each other but including an outer border 20 connecting them. This step shown diagrammatically in FIG. 2 leads for example to the creation of a configuration shown in FIG. 2b. Here are already largely defined the external connection areas 21, the connection areas 22 intended to be fixed to the connection zones of the microcircuit and the tracks 23 which connect them.

Figure 3:
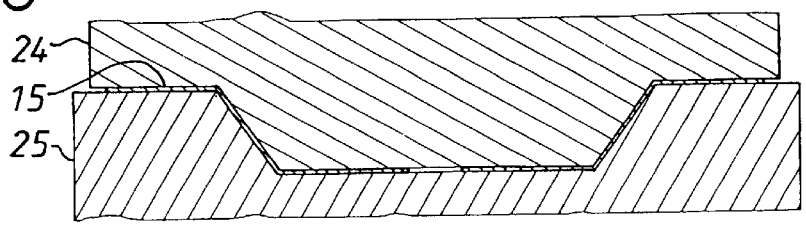
Figure 4:
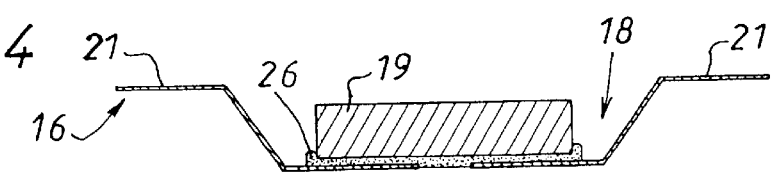
Figure 5:
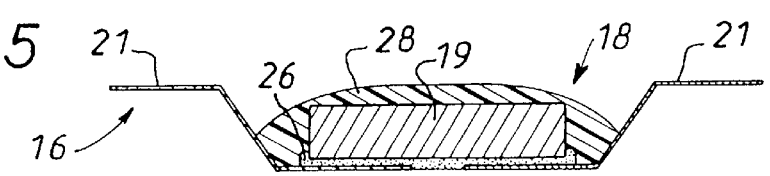
Figure 10:

The copper strip is then shaped by means of a punch and die system (24, 25) as shown in FIG. 3. This shaping leaves the external connection areas 21 positioned at a different level from the connection areas 22. Of course, the difference in level introduced by this shaping step must be less than the depth of the cavity which will be created separately in the board; it must also be greater than the thickness of the microcircuit 19.

Then, on the zone intended to receive the microcircuit, i.e. more particularly on the connection areas 22 of the blank 16, is deposited a layer of adhesive 26 to fix the microcircuit 19. This adhesive may be an insulating adhesive if the microcircuit has protrusions on its connection zones. In this case, the layer of adhesive is of sufficient thickness to ensure adhesion of the microcircuit while permitting direct electrical contact between the protrusions and the connection areas. Conversely, if the microcircuit does not include protrusions on its connection zones, it may be adhered by means of an anisotropic adhesive; it is sufficient that its own connection zones are opposite the connection areas 22. It will be recalled that an anisotropic adhesive is an adhesive which is electrically conductive in a direction in which it is of small thickness and that it is on the contrary electrically insulating in other directions.

The next operation (FIG. 4) consists of fixing the microcircuit 19 by the known "flip-chip" technique, depositing it in the container 18 so that its connection zones grouped on one of its surfaces are respectively electrically connected to the connection areas 22 of the blank. Either of the two adhesives mentioned above may be used depending on the structure of the microcircuit. Other fixing methods may also be used, in particular soldering.

Then (FIG. 5), the microcircuit 19 is covered with a drop of resin 28, this becoming rigid after polymerisation. Polymerisation may be effected thermally and/or by exposure to ultra-violet radiation. Alternatively, application of the drop of resin may be replaced by an over-filling phase which is not illustrated.

Figure 2:
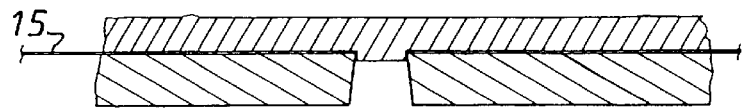
Figure 2B:
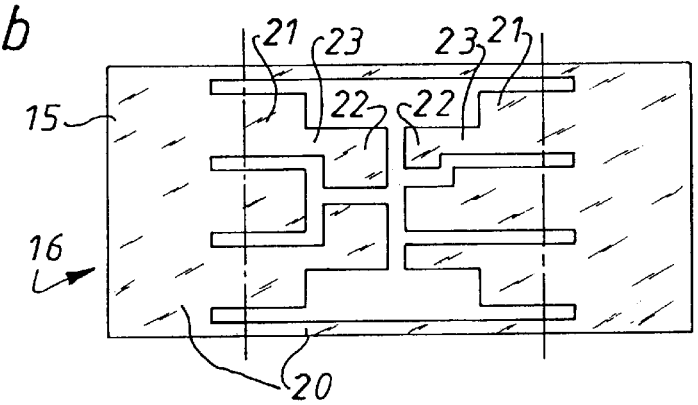

From this moment, it is important to note that the microcircuit 19 thus fixed to the said network of conductors, permanently maintains the relative positions of the different parts of this network. In other words, from this moment, the borders 20 visible in FIG. 2b are no longer necessary. They may therefore be removed.

This is the operation shown in FIG. 6. The blank of the module is picked up by a gripping organ 30 having a central orifice 31 connected to a suction source. This gripping organ is associated with a cutting tool 32 which is axially mobile relative to the gripping organ. The blank is placed in a cutting die 34 and the tool 32 is operated to remove the borders, which has the effect of completing the formation of the network 17 by individualising the external connection areas. The module 12 is then finished. After this, the module is picked up (FIG. 7) by another similar gripping organ 30a, operating by suction but combined with a heat-fixing tool 38, which is axially mobile relative to the gripping organ 30a. By these means, the module 12 is placed in the cavity 13, prepared for this purpose, in the board made of plastics material. This is the situation illustrated in FIG. 8. The heating tool 38 is operated to fix the external connection areas to the surface of the board. The tool 38 hot-plates the external connection areas onto this surface and the module is thus fixed to the board, the microcircuit 19 taking its place in the cavity 13 and being essentially held in it, at least at this stage in the process, by the network of conductors 17.

Adherence of the external connection areas 21 to the surface of the board is effected by adhesion if the strip of conductive material has been previously coated with a layer of heat-activatable adhesive. It may also occur by penetration of the thermoplastic material forming the board 14 into micro-pores formed in the surface of the conductive strip. Such pores may be created by mechanical, chemical, or heat treatment.

The final phase consists of filling the cavity 13 with a resin 40 which polymerises thermally or by exposure to ultra-violet radiation. Several cases are possible. A hard resin (i.e. of low coefficient of elongation after polymerisation) and of fairly high viscosity before polymerisation may be used. In this case, it does not flow through the interstices separating the different parts of the network 17 of conductors. In this context, the microcircuit is placed in a very rigid medium on the outer side of the board and in the empty space on the inner side, i.e. it does not directly touch the bottom of the cavity 13. This configuration is favourable to considerable reduction in the stresses transmitted to the microcircuit when the board is distorted. Conversely, filling may also be effected with a relatively fluid resin which may entirely fill the cavity in the board. In this case, the resin is preferably soft after hardening to limit transmission of stresses to the microcircuit. Filling may also commence with a fluid and soft resin and finish with a viscous and rigid resin. The module may also be fixed in the board by means of a flexible adhesive placed at the bottom of the cavity 13.

FIGS. 10 to 17 show a second exemplary embodiment of the process.

Manufacture of the module starts (FIG. 10), as before, from a sheet of conductive material 15, preferably a strip. This sheet is then cut out (FIG. 11), but in a different configuration, shown in FIG. 11b, which leaves remaining, on the sides perpendicular to the connection areas 21 and in the extension of certain connection areas 22, flaps 45 which are to be bent during the shaping phase. As in the previous example, the strip may be etched, cut, or machined so as to isolate all the elements of the network 17 from each other (FIG. 11) , while however including an outer border 20 connecting them.

Figure 12:
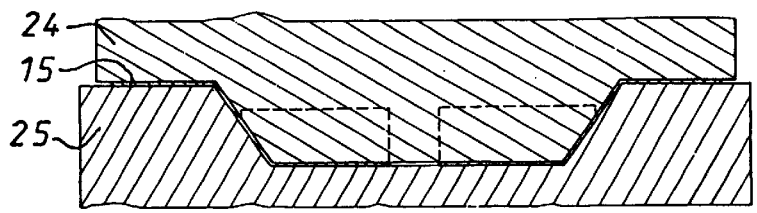
Figure 12B:
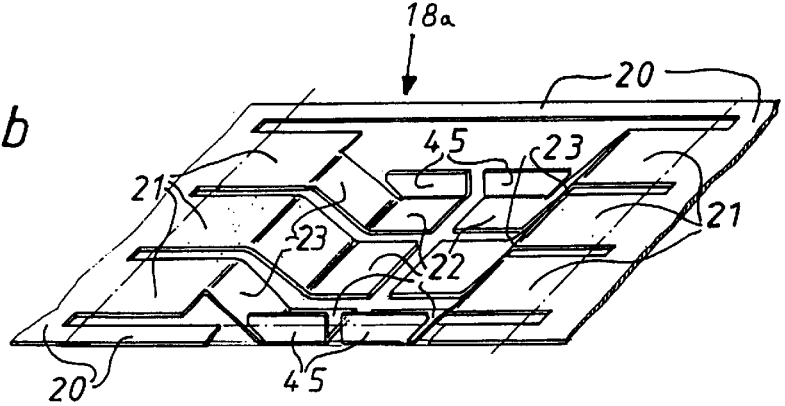
Figure 13:
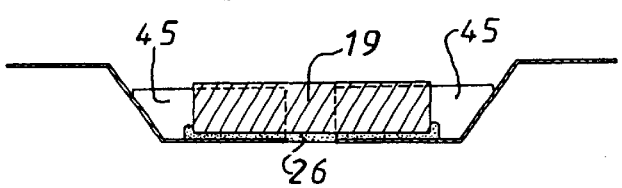

Then the sheet 15 is shaped by means of a punch and die system as shown in FIG. 12. The result of this shaping is shown in FIG. 12b. The shaping results in the external connection areas 21 being placed at a different level from the connection areas 22. The difference in level introduced must be less than the depth of the cavity and greater than the thickness of the microcircuit. However, by reason of the definition of the flaps 45 in the previous step, the said shaping step allows the creation of a container 18a substantially closed on five faces, before installation of the microcircuit 19. This container appears more precisely in FIG. 12b.

Then, on the zone intended to receive the microcircuit, i.e. more particularly on the connection areas of the blank, is deposited a layer of adhesive 26 for fixing the microcircuit 19. As before, this adhesive may be an insulating adhesive if the microcircuit has protrusions on its connection zones, or an anisotropic adhesive if the microcircuit does not have protrusions on its connection zones.

Figure 11:
Figure 11B:
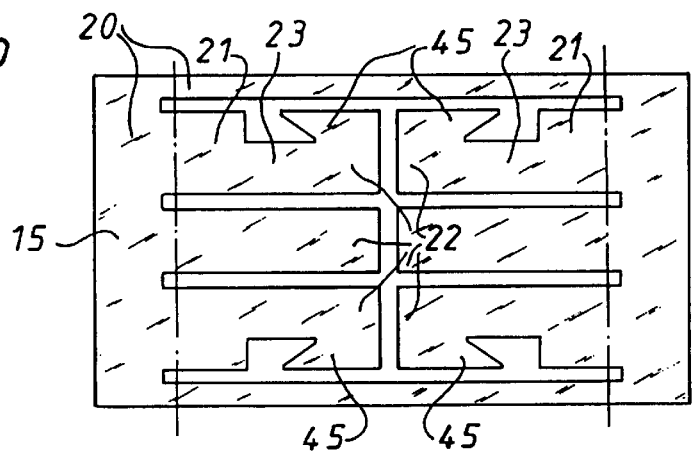

The next operation (FIG. 13) consists of fixing the microcircuit 19 by the known "flip-chip" technique, depositing it in the container illustrated in FIG. 11b. The microcircuit is positioned so that its connection zones grouped on one of its surfaces are respectively electrically connected to the connection areas 22 of the blank. Either of the adhesives mentioned above may be used, depending on the structure of the microcircuit. Other fixing methods may also be used, in particular soldering.

Then the microcircuit 19 may be covered as before with a drop of resin. In the example more particularly illustrated (FIG. 14), the blank is placed in a mould 48 to receive the resin 28a. The mould is of such dimensions that the external connection areas 21 are outside it. If the mould 48a includes a part 49 more hollowed out than the location of the connection areas 22 of the blank (FIG. 14b), the resin will be able to protect and coat the conductive areas and the active surface of the microcircuit. From this moment the borders 20 of the blank are no longer necessary. They may be removed by an operation illustrated in FIG. 15. The blank is picked up by a gripping organ 30 having a central orifice connected to a suction source. This gripping organ also includes a cutting tool 32 axially mobile relative to the gripping organ. The blank is placed in a cutting die 34 and the tool is operated to remove the borders 20, which has the effect of completing the formation of the network by individualising the external connection areas 21. The module is then finished. It is picked up by a similar gripping organ 30a operating by suction but combined with a hot-fixing tool 38, axially mobile relative to the gripping organ. By these means, the module is placed in the cavity 13 prepared for this purpose in the board 14 made of plastics material. This is the situation illustrated in FIG. 17. The heating tool 38 is operated to fix the external connection areas to the upper surface of the board. The tool hot-plates the external connection areas onto this surface and the module is thus fixed to the board. As before, the external connection areas are adhered to the surface of the board by adhesion or by penetration of the thermoplastic material forming the board into micro-pores arranged on the surface of the conductive strip.

Figure 18:
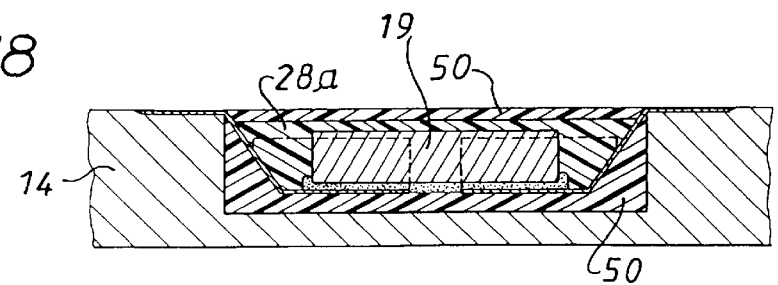

The final phase (FIG. 18) consists of filling the cavity with a flexible resin 50 which polymerises thermally or by exposure to ultraviolet radiation.

Figure 14:
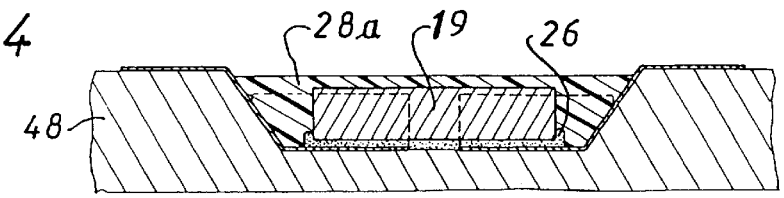
Figure 14B:
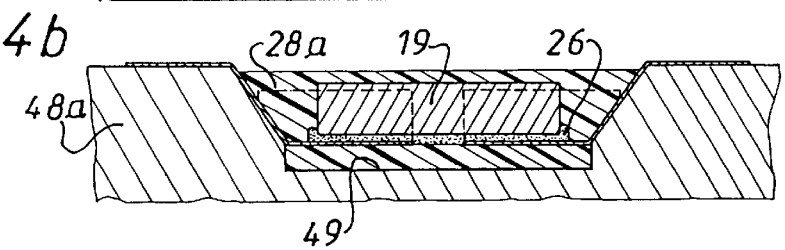
Figure 15:
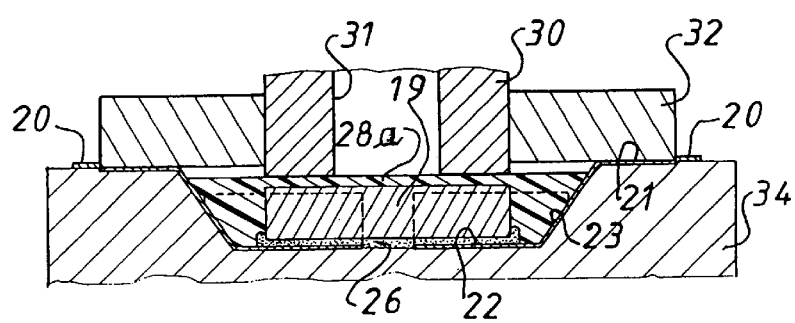
Figure 16:
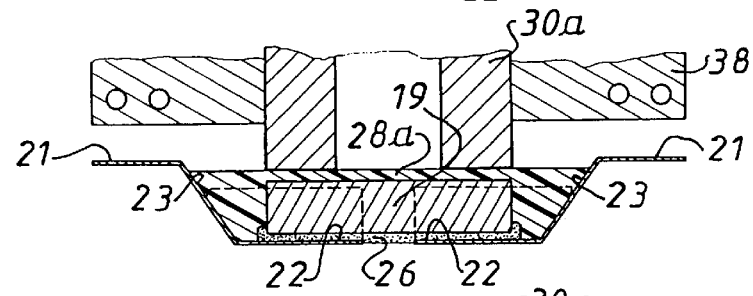
Figure 17:
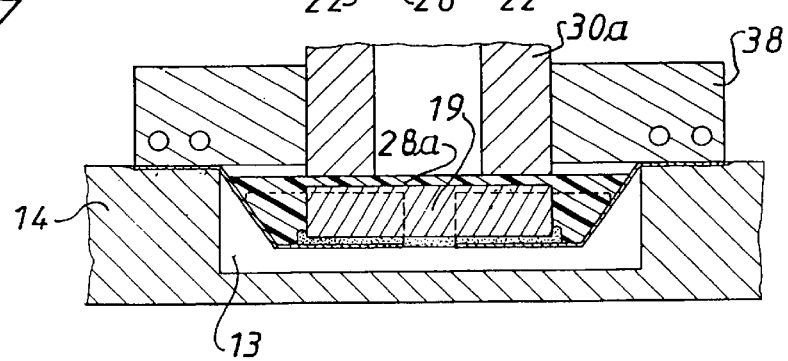

As a modification applicable to both embodiments described above, it should be noted that the above-mention operations consisting of cutting off the outer parts of the blank to individualise the connection areas and of fixing the latter to the board, may be performed simultaneously. To do this, the blank as obtained in FIG. 5 or in FIG. 14 is placed directly in the cavity 13 in the board itself, and a hot pressing-cutting operation is performed by means of a single heating tool, the outer edges of which are suitable for cutting off the borders.

Other modifications are possible.

For example, the shaping of the blank may be effected after the microcircuit is placed in position and covered with a drop of resin.

Conversely, the sheet of conductive material may be shaped before pre-cutting defining the network of conductors. This partial cutting-out is followed by installation of the microcircuit by the "flip-chip" technique. Then the microcircuit can be protected by deposition in the blank of a drop of resin or by performing an over-filling operation. Final cutting, allowing removal of the borders, is then effected and the module is placed in position and fixed in the cavity in accordance with one of the series of operations described above.

A microcircuit board made by implementation of a process in accordance with the invention is notable in particular for the fact that the active surface of the microcircuit 19 including the connection zones and the connection areas 22 of the network of conductors, to which it is connected, are not directly fixed to the bottom of the cavity but are slightly spaced apart from this bottom and separate from it, the separation space optionally being filled with a suitable material, preferably an insulating flexible resin.

We claim:

1. A method of manufacturing a microcircuit board, comprising the steps of:

arranging a cavity in a part of a thickness of a board made of insulating material for forming a support, the cavity opening on one surface of the board;

creating a network of conductors to establish electrical connections between the cavity and the surface of the board and of connecting a microcircuit to the network of conductors;

producing a module comprising the network and the microcircuit in such a manner that a blank of the network is shaped to at least partially define a container that the microcircuit is fixed to the network while keeping different parts of the network in position relative to each other;

cutting away outer parts of the blank to form external connection areas;

placing the module in the cavity without being rigidly fixed to the bottom of the cavity with the external connection areas resting on the surface; and fixing the external connection areas to the surface.

2. The method of manufacturing a circuit board of claim 1, wherein the blank is formed by cutting out the elements of the network from a sheet of conductive material including an outer border connecting them and substantially shaping the blank to define the container.

3. The method of manufacturing a circuit board of claim 1, wherein the blank is formed be shaping a sheet of conductive material defining the container and substantially cutting out in it elements of the network and leave remaining an outer border connecting them.

4. The method of manufacturing a circuit board of claim 2, further comprising the step of:

attaching the microswitch to the blank by an installation step known as "flip-chip"; and establishing the electrical connections between connection zones of the microcircuit defined on a surface of the blank and connection areas of the blank.

5. The method of manufacturing a circuit board of claim 4, wherein the microcircuit includes protrusions on its connection zones, the microcircuit being adhered to the blank by means of an insulating adhesive so that the protrusions are in electrical contact with the connection areas.

6. The method of manufacturing a circuit board of claim 4, wherein the microcircuit is adhered by means of an anistropic adhesive to the blank so that its connection zones are opposite the connection areas.

7. The method of manufacturing a circuit board of claim 1, wherein after fixing the microcircuit in the container, the process further comprises covering the microcircuit with a polymerisation hardenable resin.

8. The method of manufacturing a circuit board of claim 7, further comprising the step of:

cutting off the outer parts of the blank after covering the microcircuit with the resin.

9. The method of manufacturing a circuit board of claim 8, further comprising the step of:

conveying the module obtained after cutting off the outer parts and placing the module in the cavity of the board.

10. The method of manufacturing a circuit board of claim 7, further comprising the step of:

depositing the blank, after fixing of the microcircuit in a mould of such dimensions that the external connection areas are outside the mould; and coating the blank situated in the mould with a suitable material.

11. The method of manufacturing a circuit board of claim 7, further comprising the step of:

depositing the module in a mould of such dimensions that the external connection areas are outside the mould; and coating the module situated in the mould with a suitable material.

12. The method of manufacturing a circuit board of claim 1, further comprising the step of:

shaping the blank to produce the container, after installation of the microcircuit.

13. The method of manufacturing a circuit board of claim 1, further comprising the step of:

shaping the blank to produce the container before installation of the microcircuit.

14. The method of manufacturing a circuit board of claim 7, further comprising the step of:

shaping the blank to produce the container after coating of the microcircuit.

15. The method of manufacturing a circuit board of claim 1, wherein the sheet of conductive material from which the external connection areas are produced is covered, on one surface, with a layer of heat-activatable adhesive, the process including hot-plating the external connection areas onto the board, after the module has been placed in position in the cavity.

16. The method of manufacturing a circuit board of claim 1, wherein the sheet of conductive material from which the external connection areas are produced is provided with a surface provided with micro-pores, the process including hot-plating the external connection areas after the module has been placed in position in the cavity.

17. The method of manufacturing a circuit board of claim 1, further comprising the step of:

filling the cavity with a suitable over-coating material, after installation and fixing of the module in the cavity.

18. The method of manufacturing a circuit board of claim 1, wherein the blank is placed in the cavity, and wherein the above-mentioned operations of cutting off the outer parts of the blank and fixing the external connection areas are performed simultaneously by a hot cutting-pressing operation by means of a single heating tool.

19. The method of manufacturing a circuit board of claim 1, wherein the above-mentioned shaping step includes creating a container substantially closed on five surfaces by parts of a sheet of the conductive material, before installation of the microcircuit, and subsequently depositing in the container a suitable filling material.

20. A microcircuit board, comprising:

a board with a cavity arranged in a part of a thickness of a board made of insulating material for forming a support, the cavity opening on one surface of the board;

a microcircuit;

a network of conductors used to establish electrical connections between the cavity and the surface of the board and of connecting the microcircuit to the network of conductors; and a module comprising the network and the microcircuit in such a manner that a blank of the network is shaped to at least partially define a container that the microcircuit is fixed to the network while keeping different parts of the network in position relative to each other, wherein the outer parts of the blank are cut away to form external connection areas, the module is placed in the cavity without being rigidly fixed to the bottom of the cavity with the external connection areas resting on the surface, and the external connection areas are fixed to the surface.

* * * * *